(12) United States Patent
Shibata et al.

(10) Patent No.: US 7,082,057 B2
(45) Date of Patent: Jul. 25, 2006

(54) SEMICONDUCTOR MEMORY DEVICE (75) Inventors: Akihide Shibata, Nara (JP); Hiroshi Iwata, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 104 days.

(21) Appl. No.: 10/841,647

(22) Filed: May 10, 2004

(65) Prior Publication Data

US 2004/0233724 A1    Nov. 25, 2004

(30) Foreign Application Priority Data

May 20, 2003    (JP) ............... 2003-141880

(51) Int. Cl.
*G11C 16/06* (2006.01)
(52) U.S. Cl. .............. 365/185.2; 365/185.18; 365/185.24; 365/185.26
(58) Field of Classification Search ............ 365/185.2, 365/185.18, 185.24, 185.26
See application file for complete search history.

(56) References Cited

U.S. PATENT DOCUMENTS

| 4,881,108 A | 11/1989 | Yoshikawa | |
|---|---|---|---|
| 6,049,479 A * | 4/2000 | Thurgate et al. | 365/185.18 |
| 6,348,711 B1 | 2/2002 | Eitan | |
| 6,363,011 B1 * | 3/2002 | Hirose et al. | 365/185.07 |

FOREIGN PATENT DOCUMENTS

| JP | 5-81072 B2 | 11/1993 |
|---|---|---|
| JP | 9-116119 A | 5/1997 |
| JP | 2001-156188 A | 6/2001 |
| JP | 2001-196461 A | 7/2001 |
| JP | 2001-230332 A | 8/2001 |
| JP | 2002-246571 A | 8/2002 |
| WO | WO 99/07000 A2 | 2/1999 |
| WO | WO01/17030 A | 3/2001 |
| WO | WO03/044868 A | 5/2003 |
| WO | WO03/075358 A | 9/2003 |
| WO | WO03/075359 A | 9/2003 |
| WO | WO03/103058 A | 12/2003 |
| WO | WO2004/034474 A | 4/2004 |

* cited by examiner

*Primary Examiner*—Tuan T. Nguyen
*Assistant Examiner*—Pho M. Luu
(74) *Attorney, Agent, or Firm*—Birch, Stewart, Kolasch & Birch, LLP (57) ABSTRACT

A semiconductor memory device includes a field-effect transistor provided on a surface of a P-type transistor substrate. The field-effect transistor includes two N-type diffusion layer regions, a gate electrode, and a charge storage section. By applying a reference voltage to one of the N-type diffusion layer regions, a voltage higher than the reference voltage to the other of the N-type diffusion layer regions, a voltage lower than the reference voltage to the gate electrode, and a voltage higher than the reference voltage to the P-type semiconductor substrate, holes are injected into the charge storage section. Because the forward voltage is applied to a PN junction between one of the N-type diffusion layer regions and the P-type semiconductor substrate, it is possible to inject the holes into the charge storage section at the voltages lower than the voltages required if the forward voltage is not applied. Therefore, it is possible to decrease operating voltages of the semiconductor memory device. Thus provided is a semiconductor memory device including a field-effect-transistor type non-volatile memory that allows for rewrite operation at lower voltages.

20 Claims, 8 Drawing Sheets

PRIOR ART

SEMICONDUCTOR MEMORY DEVICE

This nonprovisional application claims priority under 35 U.S.C. § 119(a) on Patent Application No. 2003-141880 filed in Japan on May 20, 2003, the entire contents of which are hereby incorporated by reference.

FIELD OF THE INVENTION

The present invention relates in general to semiconductor memory devices, and in particular to those including field-effect transistors capable of converting an amount of charge into an amount of electric current.

BACKGROUND OF THE INVENTION

Among conventional non-volatile memories, a memory developed by Saifun Semiconductors Ltd. is a typical one. See Japanese Publication for Unexamined Patent Publication 2001-156189 (Tokukai 2001-156189; published on Jun. 8, 2001), an equivalent to U.S. Pat. No. 6,348,711 B1 (date of patent: Feb. 19, 2002). The following discusses the structure of this conventional memory and how erase operation is performed.

Figure 8:
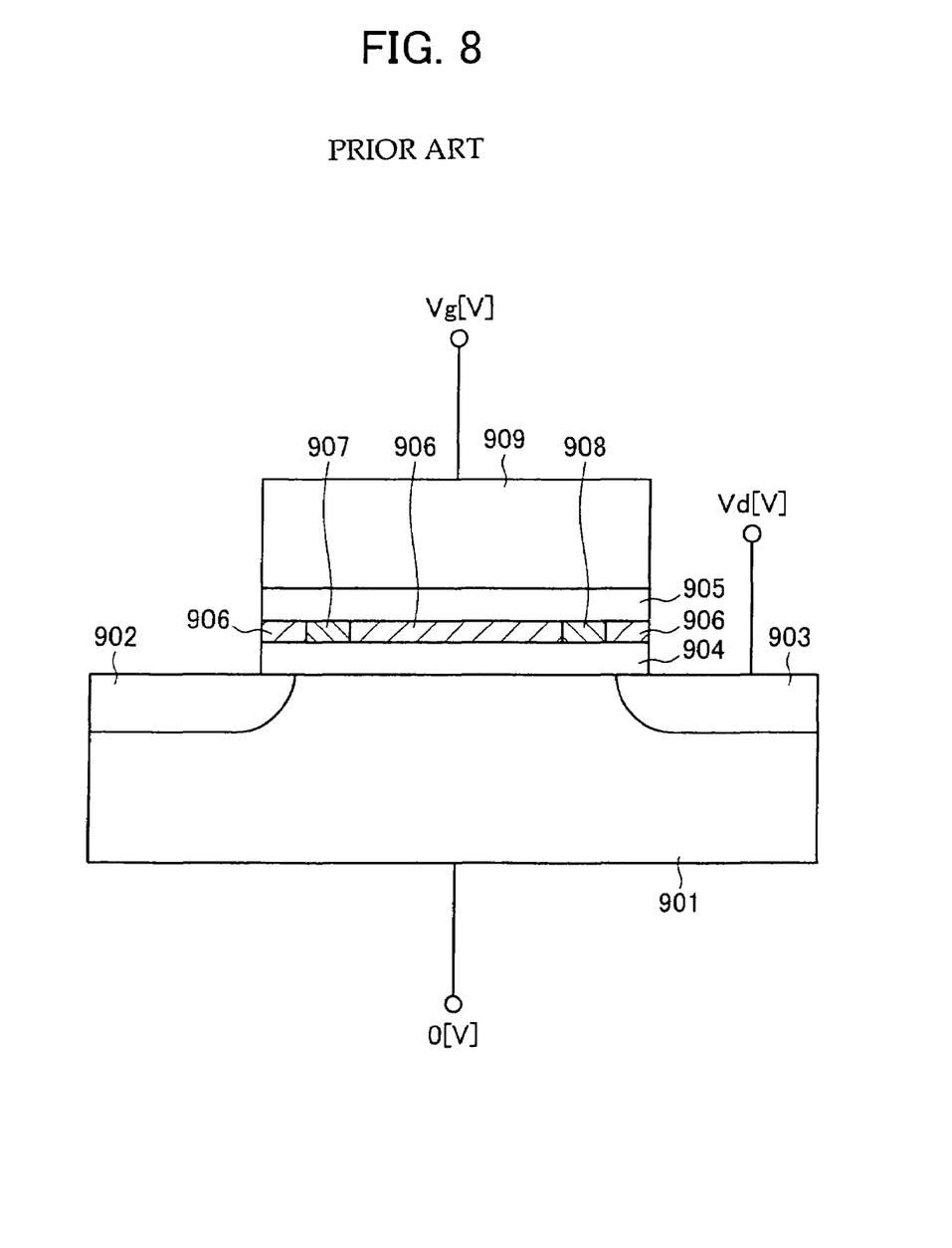
FIG. 8 is a schematic cross-sectional view illustrating a major part of a conventional semiconductor memory device.

The memory, as shown in FIG. 8, includes a gate electrode 909, a first N-type diffusion layer region 902, and a second N-type diffusion layer region 903. The gate electrode 909 is provided above a P-well region 901 with an intervening gate insulating film. The first N-type diffusion layer region 902 and the second N-type diffusion layer region 903 are provided on a surface of the P-well region 901.

The gate insulating film is an "ONO" (Oxide Nitride Oxide) film, in which a silicon nitride film 906 is sandwiched between silicon oxide films 904 and 905. In the silicon nitride film 906, provided in the vicinity of respective ends of the first N-type diffusion layer region 902 and the second N-type diffusion layer region 903 are a first memory (charge) storage section 907 and a second memory (charge) storage section. Amounts of charge in the memory storage sections 907 and 908 can be independently read out in the form of drain currents of the transistor.

Discussed next is a method for erasing information from the memory. Here, to "erase" means to decrease electrons stored in the memory storage sections 907 and 908. In the erase operation disclosed in Japanese Publication for Unexamined Patent Publication 2001-156189, the electrons stored in the second memory storage section 908 are decreased by applying a positive voltage Vd to the drain electrode (the second N-type diffusion layer region 903), and a negative voltage Vg to the gate electrode 909.

When the voltages are applied, a PN junction between the P-well region 901 and the N-type diffusion layer region 903 is subjected to a strong reverse bias. The strong reverse bias causes inter-band tunneling, thereby generating holes. The holes are pulled toward the gate electrode, which is subjected to a negative voltage. Thus, the holes are injected into the second memory storage section 908. In the second memory storage section 908, the holes are bonded again with the electrons stored therein. As a result, the electrons stored in the second memory storage section 908 are virtually decreased. Information is thus erased from a specified one of the two memory storage sections 907 and 908.

However, it requires a high voltage to pull the electrons out of the memory storage section and lead the electrons toward the drain electrode. The conventional memory is problematic in this respect.

For example, as is clear from above, in order to erase information from the second memory storage section 908, it is necessary to cause the inter-band (band to band) tunneling at the PN junction between the P-well region 901 and the second N-type diffusion layer region 903. To cause the inter-band tunneling, the potential needs to show a sufficiently steep transition at the PN junction. This means that the PN junction needs to be subjected to a strong reverse bias. Thus, it requires a high voltage to rewrite information stored in a memory cell of the conventional memory.

SUMMARY OF THE INVENTION

The present invention, conceived to address this problem, has an objective to provide a semiconductor memory device including a field-effect-transistor-type non-volatile memory capable of performing rewrite operation at lower voltages.

In order to achieve the objective, a first semiconductor memory device of the present invention includes a field-effect transistor provided on a surface of at least one of (i) a P-type semiconductor substrate, (ii) a P-well region provided in a semiconductor substrate, and (iii) a P-type semiconductor film provided on an insulator, the field-effect transistor including two N-type diffusion layer regions, a gate electrode, and a charge storage section, holes being injected into the charge storage section by applying a reference voltage to one of the N-type diffusion layer regions, a voltage higher than the reference voltage to the other of the N-type diffusion layer regions, a voltage lower than the reference voltage to the gate electrode, and a voltage higher than the reference voltage to the at least one of (i) the P-type semiconductor substrate, (ii) the P-well region, and (iii) the P-type semiconductor film.

In this arrangement, in injecting the holes into the charge storage section of the field-effect transistor, the forward voltage is applied to a PN junction between one of the N-type diffusion layer regions and the at least one of (i) the P-type semiconductor substrate, (ii) the P-well region, and (iii) the P-type semiconductor film. Therefore, it is possible to inject the holes into the charge storage section at the voltages lower than the voltages required if the forward voltage is not applied. This makes it possible to decrease operating voltages of the semiconductor memory device. Therefore, it is possible to suppress deterioration of the semiconductor memory device, and to attain lower power consumption.

A second semiconductor memory device of the present invention includes a field-effect transistor provided on a surface of at least one of (i) an N-type semiconductor substrate, (ii) an N-well region provided in a semiconductor substrate, and (iii) a P-type semiconductor film provided on an insulator, the field-effect transistor including two P-type diffusion layer regions, a gate electrode, and a charge storage section, electrons being injected into the charge storage section by applying a reference voltage to one of the P-type diffusion layer regions, a voltage lower than the reference voltage to the other of the P-type diffusion layer regions, a voltage higher than the reference voltage to the gate electrode, and a voltage lower than the reference voltage to the at least one of (i) the N-type semiconductor substrate, (ii) the N-well region, and (iii) the N-type semiconductor film.

The second semiconductor memory device of the present invention is identical to the first semiconductor memory device of the present invention except that the field-effect transistor is P-channel type in terms of polarity. Therefore, effects of the second semiconductor memory device of the present invention are identical to those of the first semiconductor memory device of the present invention.

For a fuller understanding of the nature and advantages of the invention, reference should be made to the ensuing detailed description taken in conjunction with the accompanying drawings.

DESCRIPTION OF THE EMBODIMENTS

A semiconductor memory device of the present invention is a field-effect-transistor-type memory device including, on a semiconductor substrate, two diffusion layer regions and a gate electrode, an amount of charge stored in a charge storage section representing information stored, the amount of charge stored in the charge storage section being changed by applying a forward bias to a PN junction between one of the diffusion layer regions and the semiconductor substrate.

The charge storage section of the semiconductor memory device of the present invention is preferably provided on the semiconductor substrate, more particularly in an N-well or P-well region provided in the semiconductor substrate.

The semiconductor substrate is not particularly limited, as long as the substrate is designed for use in a semiconductor device. Examples of the semiconductor substrate include substrates made of semiconductor element, such as silicon or germanium, or a semiconductor compound, such as GaAs, InGaAs, or ZnSe; SOI (Silicon On Insulator) substrates, multilayer SOI substrates, and like substrates. A preferred one is a silicon substrate or an SOI substrate whose surface semiconductor layer is made of silicon. On the semiconductor substrate, preferably a component isolation region is provided. The semiconductor memory device may include a single or multiple layers having a circuit, a semiconductor device, an interlayer insulating film, or a combination thereof. The circuit may have a transistor, a capacitor, a resistor, or other component.

The component isolation region can be made from various kinds of component isolation film, including LOCOS (Local Oxidation of Silicon) film, trench oxide film, and STI (Shallow Trench Isolation) film. The semiconductor substrate may be either P-type or N-type, and is preferably provided with at least one well region of either P-type or N-type. The concentrations of impurities (dopant) in the semiconductor substrate and well region are within the range publicly known in the art. When an SOI substrate is used as the semiconductor substrate, the surface semiconductor layer may be a well region, or may be a body region under the channel region.

As described in the following embodiments, a gate insulating film may also function as the charge storing section. In this case, the gate insulating film may be structured, for example, by sandwiching (i) a polysilicon film between silicon oxide films, (ii) a silicon nitride film between silicon oxide films, or (iii) an aluminum oxide film between silicon oxide films.

Alternatively, the charge storage section may be provided separately from the gate insulating film, so that functions of the gate insulating film and of the charge storage section are separated. In this case, the charge storage section may be contained in a gate side wall spacer, for example.

When the functions of the gate insulating film and of the charge storage section are separated, the gate insulating film is not particularly limited, as long as the gate insulating film is of a kind typically used for semiconductor devices. Examples of the gate insulating film include insulating films such as silicon oxide films and silicon nitride films; and high dielectric films, such as aluminum oxide films, titanium oxide films, tantalum oxide films, and hafnium oxide films, in the form of a single or multilayer film. Especially preferred among them is a silicon oxide film.

The gate electrode is formed on the gate insulating film in an ordinary manner for use in semiconductor devices. The gate electrode is not particularly limited. The gate electrode is made from a single or multilayer conductive film of, for example, a polysilicon; metal, such as copper or aluminum; high melting point metal, such as tungsten, titanium, or tantalum; or high melting point metal silicide. An appropriate thickness of the gate electrode is about 50 nm to 400 nm, for example.

Source/drain regions are diffusion layer regions whose conduction type is opposite the conduction type of the semiconductor substrate or the well region. The source/drain regions are respectively provided on both sides of the gate electrode. Preferably, the concentration of impurity preferably shows a steep transition at the junction between (i) the source/drain regions and (ii) the semiconductor layer or the well region. If the concentration of impurity shows a steep transition, the potential also shows a steep transition at the junction. As a result, hot electrons and hot holes are generated efficiently at low voltages. This allows for high-speed operation at lower voltages.

A junction depth in the source/drain regions is not particularly limited, and may be adjusted if necessary in accordance with, for example, desired performance of the semiconductor memory device. When an SOI substrate is used as the semiconductor substrate, the junction depth in the source/drain regions may be shallower than the thickness of the surface semiconductor layer. It is however preferred if the junction depth in the source/drain regions is substantially equal to the thickness of the surface semiconductor layer.

In the semiconductor memory device of the present invention, each operation (write operation, erase operation, and read operation) is performed by applying predetermined potentials respectively to the four terminals, i.e. the gate electrode on the gate insulating film, the source/drain regions (the first diffusion layer region and the second diffusion layer region), and the semiconductor substrate.

Note that the semiconductor memory device of the present invention may be that of an N-channel type whose source region and drain region are N-type, or of a P-channel type whose source region and drain region are P-type.

If the semiconductor memory device is that of the N-channel type, the "erase operation" refers to injecting holes into the charge storage section, that is, decreasing the electrons stored in the charge storage section. If the semiconductor memory device is that of the P-channel type, the "erase operation" refers to injecting electrons into the charge storage section, that is, decreasing the holes stored in the charge storage section.

If the semiconductor memory device is that of the N-channel type, the "write operation" refers to injecting electrons into the charge storage section, that is, increasing the electrons stored in the charge storage section. The following discusses a case in which the semiconductor memory device is that of the N-channel type. If the semiconductor memory device is that of the P-channel type, the roles of the electrons and of holes are replaced with one another, and signs of the applied voltages are reversed.

In the (N-channel type) semiconductor memory device of the present invention, the erase operation is performed, i.e. holes are injected into the charge storage section, by applying a reference voltage to one of the N-type diffusion layer regions, a voltage higher than the reference voltage to the other of the N-type diffusion layer regions, a voltage lower than the reference voltage to the gate electrode, and a voltage higher than the reference voltage to the P-type semiconductor substrate (alternatively, the P-well region provided in the semiconductor substrate or the P-type semiconductor film provided on an insulator).

In other words, a reference voltage is applied to the P-type semiconductor substrate (alternatively, the P-well region provided in the semiconductor substrate or the P-type semiconductor film provided on an insulator), a voltage lower than the reference voltage is applied to one of the N-type diffusion layer regions, a voltage higher than the reference voltage is applied to the other of the N-type diffusion layer regions, and a voltage lower than the reference voltage is applied to the gate electrode. This erase method is clearly distinct from the conventional erase method, in that in the former the forward voltage is applied to the PN junction between one of the N-type diffusion layer regions and the P-type semiconductor substrate.

Details on how to perform the erase operation, and examples of operating voltages are provided later. According to the foregoing erase operation, it is possible to decrease voltages required for the erase operation. Therefore, it is possible to suppress deterioration of the semiconductor memory device, and to attain lower power consumption.

The semiconductor memory device of the present invention can be manufactured generally by an ordinary process for manufacturing field-effect transistors. For example, if the charge storage section of the semiconductor memory device is contained in the gate side wall spacer, the semiconductor memory device may be manufactured by an ordinary process for manufacturing field-effect transistors, except that the side wall spacer having a function of storing charge is formed on a sidewall of the gate electrode.

The semiconductor memory device of the present invention can be used for portable electronic devices driven by batteries, especially portable information terminals. Examples of the portable electronic devices are portable information terminals, cellular phones, game machines, and the like.

With reference to the drawings, the following more specifically describes the semiconductor memory device of the present invention.

First Embodiment

Figure 1:
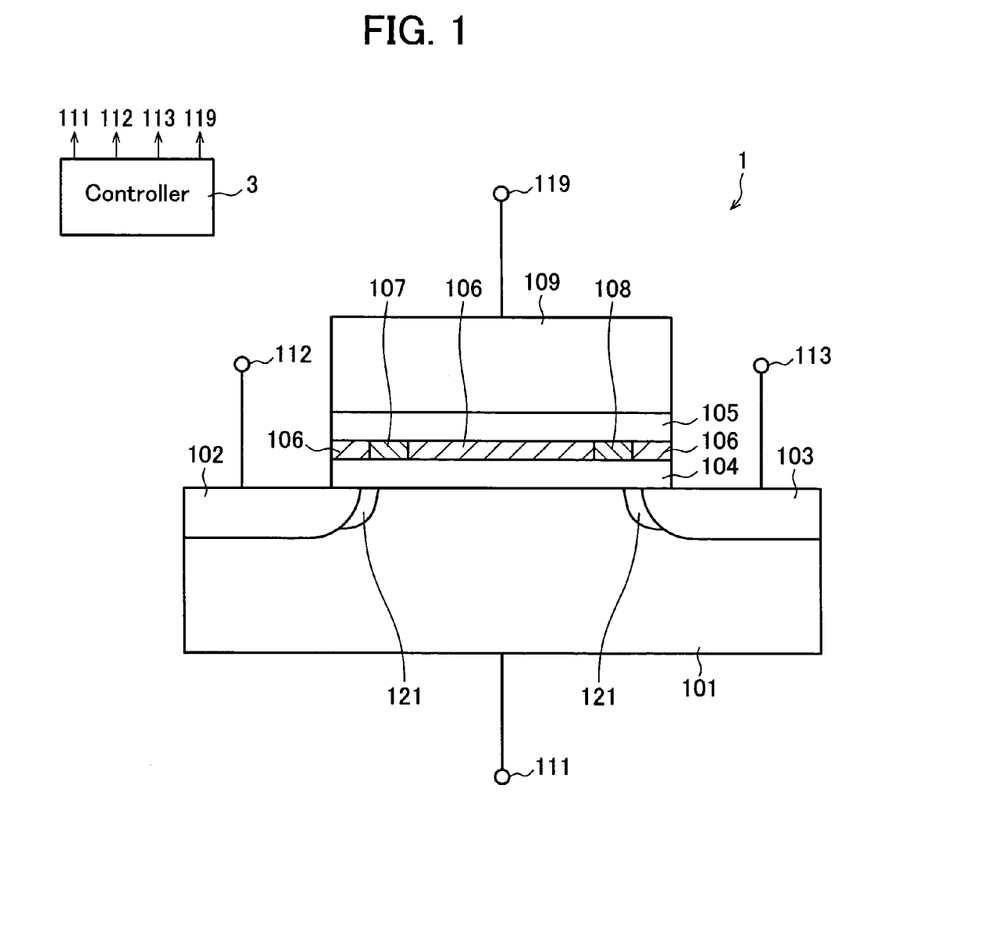
FIG. 1 is a schematic cross-sectional view illustrating a major part of a first example of a semiconductor memory device of the present invention.
Figure 2:
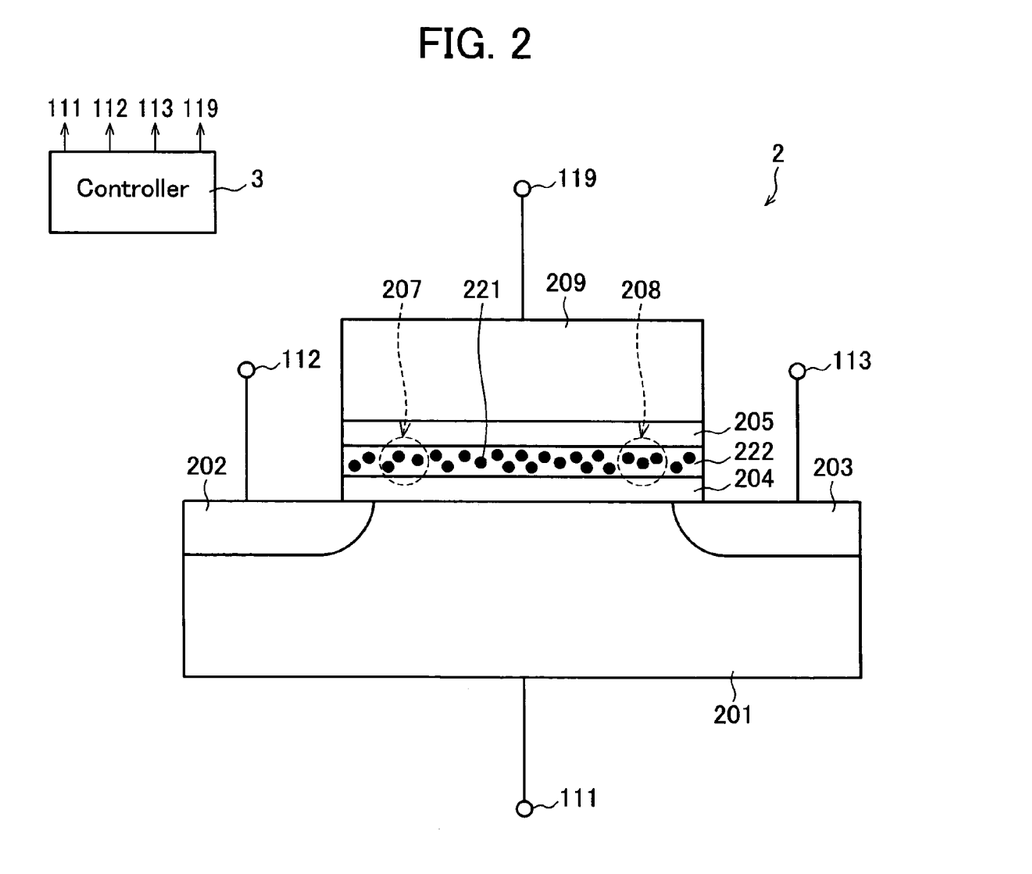
FIG. 2 is a schematic cross-sectional view illustrating a major part of a variation of the first example of the semiconductor memory device of the present invention.
Figure 3:
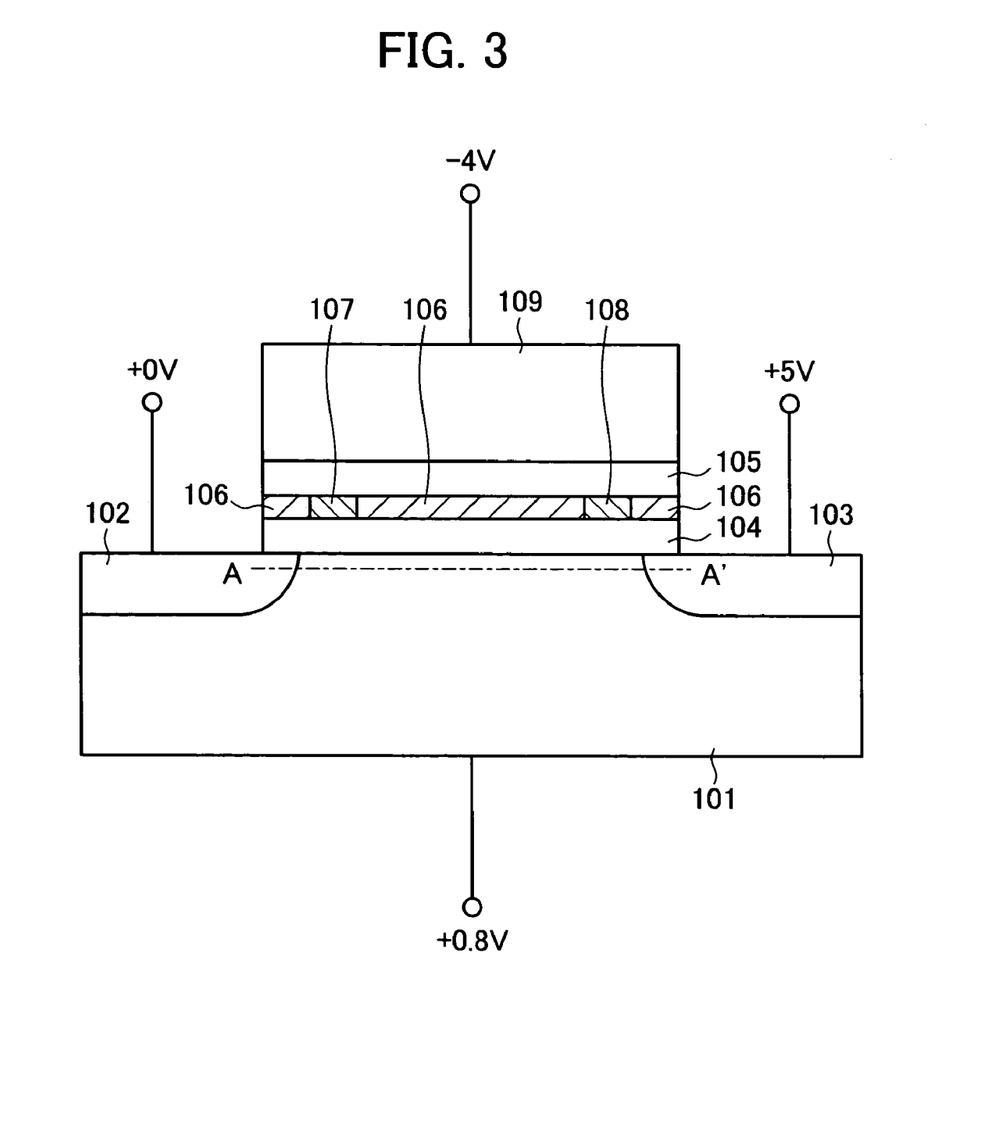
FIG. 3 is a schematic cross-sectional view illustrating how information is erased from the first example of the semiconductor memory device of the present invention.
Figure 4:
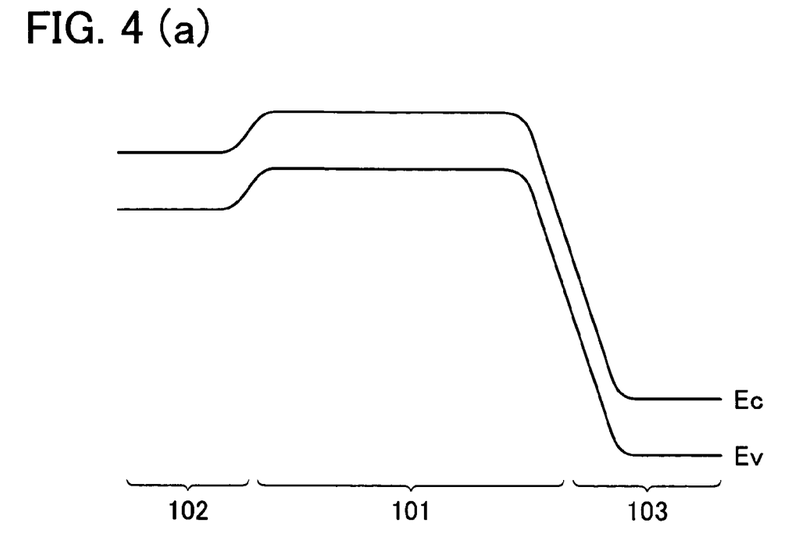
FIGS. 4(a) and 4(b) are diagrams illustrating energy bands with respect to electrons along with the cross-sectional line A–A' in FIG. 3; no voltage is supplied in FIG. 4(a), while voltages are supplied in FIG. 4(b).

With reference to FIGS. 1 to 4, a memory element that constitutes the semiconductor memory device of the present invention is described. FIG. 1 is a schematic cross-sectional view illustrating one example of the memory element. FIG. 2 is a schematic cross-sectional view illustrating a variation example of the memory element. FIG. 3 illustrates voltages applied in order to erase information from the memory element. FIG. 4 explains how to perform the erase operation. The following discusses a case in which the memory element is that of the N-channel type. If the memory element is that of the P-type, the conduction type of each section of the memory element is reversed, the roles of electrons and of holes are replaced with one another, and signs of the voltages applied to terminals in order to induce the erase operation are reversed.

FIG. 1 is a cross-sectional view illustrating a memory element 1 of the first embodiment of the present invention. The memory element 1 has an ONO (Oxide Nitride Oxide) triple-layer structure as a gate dielectric structure. In a semiconductor substrate 101 whose conduction type is P-type, there are provided a first diffusion layer region 102 and a second diffusion layer region 103, both of which are N-type. At boundaries between (i) the semiconductor substrate 101 and (ii) the two diffusion layer regions 102 and 103, PN junctions are formed respectively.

The first diffusion layer region 102 and the second diffusion layer region 103 are provided on a surface of the semiconductor substrate 101 in such a manner as to be isolated from one another and face-to-face with one another in a direction of the surface.

Thus, between the diffusion layer regions 102 and 103 is a channel region. On the channel region, a silicon oxide film 104 is laminated. The silicon oxide film 104 is preferably between 1.5 nm and 15 nm in thickness.

On the silicon oxide film 104, a charge trapping film 106 is laminated. The charge trapping film 106 is preferably between 2 nm to 15 nm in thickness. Moreover, the charge trapping film 106 is preferably a silicon nitride film or an aluminum oxide film. If the charge trapping film 106 is the silicon nitride film or aluminum oxide film, the charge trapping film 106 densely traps charge. Therefore, a memory effect of the memory element 1 is increased. The charge injected into the charge trapping film 106 is trapped in the charge trapping film 106. Thus, the charge trapping film 106 functions as a memory storage film.

The charge trapping film 106 may be other than the silicon nitride film or aluminum oxide film. For example, the charge trapping film 106 may be a silicon oxide film in which silicon particles are dispersed, or a silicon oxide film into which arsenic or the like impurity is injected. The silicon oxide film 104 is preferably not less than 1.5 nm in thickness, so that the charge trapped in the charge trapping film 106 will not be scattered and lost by tunneling through the silicon oxide film 104. This allows the memory element 1 of the present invention to have an excellent information-storing property.

The memory element 1 is capable of storing two bits of information. The charge is stored in a first memory (charge) storage section 107 and a second memory (charge) storage section 108. The first memory storage section 107 is provided in such a position as to face an end or its vicinity of the first diffusion layer region 102, the end of the first diffusion layer region 102 being nearer to the silicon oxide film 104. The second memory storage section 108 is provided in such a position as to face an end or its vicinity of the second diffusion layer region 103, the end of the second diffusion layer region 103 being nearer to the silicon oxide film 104.

On the charge trapping film 106, a silicon oxide film 105 is laminated. On the silicon oxide film 105, a gate electrode 109 is laminated. The silicon oxide film 105 has a function of insulating between the charge trapping film 106 and the gate electrode 109. The silicon oxide film 105 is preferably between 1.5 nm and 15 nm in thickness, so that the charge trapped in the charge trapping film 106 will not be scattered and lost by tunneling through the silicon oxide film 105. The gate electrode 109 is made of polysilicon and is 150 nm in thickness, for example.

The charge trapping film 106 may be other than the silicon nitride film, aluminum oxide film, or silicon oxide film including an impurity. For example, the charge trapping film 106 may be a silicon oxide film 222 in which a plurality of silicon particles 221 are dispersed, as shown in a memory element 2 of FIG. 2. In the memory element 2, 201 is a semiconductor substrate whose conduction type is P-type; 202 is a first diffusion layer region whose conduction type is N-type; 203 is a second diffusion layer region whose conduction type is N-type; 204 and 205 are silicon oxide films; and 209 is a gate electrode. Like the memory element 1, the memory element 2 is also capable of storing two bits of information. The charge is stored in a first memory storage section 207 and a second memory storage section 208.

Each of the memory elements 1 and 2 shown in FIGS. 1 and 2 are provided with (i) a terminal 111 through which a voltage is applied to the semiconductor substrate 101 or 201, (ii) terminals 112 and 113 through which voltages are applied to the diffusion layers 102 and 103/202 and 204, and (iii) a terminal 119 through which a voltage is applied to the gate electrode 109 or 209.

Each of the memory elements 1 and 2 is provided with a controller 3 for controlling the write, read, and erase operations (which are described later) in the memory element 1 or 2. The controller 3 adjusts the voltages applied to the terminals 111, 112, 113, and 119, and timings of the voltages.

Note that, although the controller 3 is not shown in those figures other than FIGS. 1 and 2, memory elements shown in those figures are also provided with controllers having the same function.

Write Operation

Information is written into the memory element 1 of FIG. 1 in the same way with which information is written into memory cells of conventional flash EEPROMs. That is, in order to write information into the second memory storage section 108, positive voltages are applied to the gate electrode 109 and the second diffusion layer region 103, respectively. Specifically, for example, +5V is applied to the gate electrode 109, and +7V is applied to the second diffusion layer region 103.

Thus, the first diffusion layer region 102 is used as a source region, and the second diffusion layer region 103 is used as a drain region. In this way, hot electrons are generated in the vicinity of the boundary between the channel region and the second diffusion layer region 103, and are trapped in the second memory storage section 108 of the charge trapping section 106. What is important here is that the injected electrons are localized in the second memory storage section 108. Therefore, a threshold value does not uniformly increase throughout the channel region, but increases only at a position immediately under the second memory storage section 108.

In case information is written into the first memory storage section 107, the same way with which information is written into the second memory storage section 108 may be used, except that the first diffusion layer region 102 and the second diffusion layer region 103 are replaced with one another. That is, the voltage applied to the first diffusion layer region 102 and the voltage applied to the second diffusion layer region 103 are replaced. As described above, information may be written into either one of the first memory storage section 107 and the second memory storage section 108 selectively. Thus, information can be written into the memory element of the present invention by two-bit writing.

Read Operation

In order to read information from the memory element 1 of FIG. 1, the same way with the write operation may be used, except that the roles of the source region and of the drain region are replaced with one another. As described above, in order to write information into the second memory storage section 108, the first diffusion layer region 102 is used as the source region, and the second diffusion layer region 103 is used as the drain region. On the other hand, in order to read information from the second memory storage section 108, the first diffusion layer region 102 is used as the drain region, and the second diffusion layer region 103 is used as the source region.

Specifically, for example, +2V is applied to the first diffusion layer region 102, and +3V is applied to the gate electrode 109. As a result, the threshold value increases and therefore a drain current decreases if a large number of electrons are trapped in the second memory storage section 108, and the threshold value decreases and therefore the drain current increases if a small number of electrons (or a large number of holes) are trapped in the second memory storage section 108.

Under the foregoing condition on voltages, a pinch-off is caused in the channel region right under the first memory storage section 107. Therefore, the amount of charge in the first memory storage section 107 hardly influences the threshold value and an amount of the drain current. Thus, it is possible to selectively read information only from the second memory storage section 108.

In order to read information from the first memory storage section 107, the same way with which information is read from the second memory storage section 108 may be used, except that the first diffusion layer region 102 and the second diffusion layer region 103 are replaced with one another. That is, the voltage applied to the first diffusion layer region 102 and the voltage applied to the second diffusion layer region 103 are replaced with one another. As described above, information may be read from either one of the first memory storage section 107 and the second memory storage section 108 selectively. Thus, information can be read from the memory element 1 by two-bit reading.

Erase Operation

In order to erase information stored in the second memory storage section 108, as shown in FIG. 3, a positive voltage (e.g. +5V) is applied to the second diffusion layer region 103, 0V is applied to the first diffusion layer region 102, a negative voltage (e.g. −4V) is applied to the gate electrode 109, and a positive voltage (e.g. +0.8V) is applied to the P-type semiconductor substrate 101. That is, a reference voltage is applied to one of the N-type diffusion layer regions (the first diffusion layer region 102), a voltage higher than the reference voltage is applied to the other of the N-type diffusion layer regions (the second diffusion layer region 103), a voltage lower than the reference voltage is applied to the gate electrode 109, and a voltage higher than the reference voltage and lower than the voltage applied to the other of the N-type diffusion layer regions (the second diffusion layer region 103) is applied to the P-type semiconductor substrate 101.

Because the voltages applied to nodes (the terminals) are relative to one another, if the voltage applied to the P-type semiconductor substrate 101 is set as a reference voltage (0V), the foregoing condition can be expressed that +4.2V is applied to the second diffusion layer region 103, −0.8V is applied to the first diffusion layer region 102, and −4.8V is applied to the gate electrode 109. This condition can be also expressed that a reference voltage is applied to the P-type semiconductor substrate 101, a voltage lower than the reference voltage is applied to one of the N-type diffusion layer regions (the first diffusion layer region 102), a voltage higher than the reference voltage is applied to the other of the N-type diffusion layer regions (the second diffusion layer region 103), and a voltage lower than the reference voltage and lower than the voltage applied to the one of the N-type diffusion layer regions (the first diffusion layer region 102) is applied to the gate electrode 109.

In case the semiconductor memory device of the present invention is arranged in cell array, it is preferable if the P-type semiconductor substrate is shared by memory elements (that is, if memory cell array is formed on a single P-type semiconductor substrate, or if memory cell array is formed on a common P-well region provided in the semiconductor substrate), and a potential of the P-type semiconductor substrate is fixed during operation. If the P-type semiconductor substrate is shared, PN junctions of the P-type semiconductor substrate have very large area. If the potential of the P-type semiconductor substrate is changed in this case, a large current flow is generated in order to charge capacitors at the PN junctions. This is why it is preferable if the potential of the P-type semiconductor substrate is fixed during operation.

FIGS. 4(a) and 4(b) are energy diagrams (energy band diagrams) with respect to electrons in the cross-sectional line A–A' in FIG. 3. FIG. 4(a) illustrates a case in which 0V, which is identical to the voltage applied to the first diffusion layer region 102, is applied to the P-type semiconductor substrate 101 (potentials of the other nodes are as shown in FIG. 3). FIG. 4(b) illustrates a case in which +0.8V is applied to the P-type semiconductor substrate 101 (that is, the case shown in FIG. 3). In FIGS. 4(a) and 4(b), Ec is an end of a conduction electron band, and Ev is an end of a valence electron band. Between Ec and Ev is a band gap.

In the case of FIG. 4(a), it is necessary that the P-type semiconductor substrate 101 and the second diffusion layer region 103 have a potential difference sufficient for causing inter-band tunneling. As a result of an experiment, information was not erased when 0V was applied to the P-type semiconductor layer and to the first diffusion layer region 102 (the potentials of the other nodes were as shown in FIG. 3).

That is, the voltage applied to the PN junction between the P-type semiconductor substrate 101 and the N-type second diffusion layer region 103 was not sufficient for causing inter-band tunneling. However, information was erased when a forward voltage (+0.8V) was applied to the PN junction between the P-type semiconductor substrate 101 and the N-type second diffusion layer region 103 (the condition of FIG. 3). This suggests that it is possible to decrease the voltages required for the erase operation.

As shown in FIG. 4(b), when the forward voltage is applied, the potential of the P-type semiconductor substrate 101 is decreased from the dotted line to the solid line. As a result, electrons 151 are injected from the first diffusion layer region 102 into the P-type semiconductor substrate 101. When the electrons 151 injected into the P-type semiconductor substrate 101 reaches the PN junction between the second diffusion layer region 103 and the P-type semiconductor substrate 101, the electrons 151 are accelerated by an electric field. The electrons 151 thus scatter, and lose energy (electrons 152). The energy lost at this time is received by electrons in the valence electron band, thereby generating pairs of an electron 153 and a hole 154. Thus, holes are generated at the PN junction between the second diffusion layer region 103 and the P-type semiconductor substrate 101, and the holes are injected into the second memory storage section 108. As a result, information is erased.

With this erase method, it is possible to generate holes and perform the erase operation even if the reverse biases applied to the second diffusion layer region 103 and the P-type semiconductor substrate 101 are relatively small. This makes it possible to decrease operating voltages of the memory element 1. As a result, it is possible to attain lower power consumption, and to suppress deterioration of the memory element.

The information was erased when the forward bias applied between the first diffusion layer region 102 and the P-type semiconductor substrate 101 was 0.7V or higher. On the other hand, information was not erased when the forward bias applied between the first diffusion layer region 102 and the P-type semiconductor substrate 101 was lower than 0.7V. When the forward bias was higher than 1.0V, a forward current increased, thereby drastically increasing power consumption in the erase operation. Therefore, it is preferable if the forward bias is not lower than 0.7V and not higher than 1V.

In order to erase information stored in the first memory storage section 107, the same way with which information is erased from the second memory storage section 108 may be used, except that the potential of the first diffusion layer region 102 and the potential of the second diffusion layer region 103 are replaced with each other.

In the foregoing operation methods, two bits of information are rewritten and read with respect to one transistor by replacing the source electrode and the drain electrode with one another. However, the memory element may be used as a one-bit memory by fixing the source electrode and the drain electrode. In this case, if the memory element is arranged in cell array, a common fixed voltage may be applied to one of the source/drain regions, thereby halving the number of bit lines connected to the source/drain regions.

Discussed next is a preferred thickness of the ONO film seen from the viewpoint of the foregoing operation methods. When the silicon oxide film 104 is thinner than 1.5nm, the electrons (charge) stored in the memory storage sections 107 and 108 are scattered. As a result, the storing property of the memory element 1 is deteriorated. On the other hand, if the silicon oxide film 104 is thicker than 15 nm, a longer time will be required for rewriting information into the memory element 1, and a short-channel effect of the memory element 1 will be accelerated. Therefore, it is preferable if the silicon oxide film 104 is between 1.5 nm and 15 nm in thickness.

The charge trapping film 106 is preferably between 2 nm and 15 nm in thickness. If the charge trapping film 106 is thinner than 2 nm, it is difficult to form each charge trapping film 106 to have uniform thickness and quality. As a result, the amount of charge is different from one memory element 1 to the other, resulting in a significant difference between one memory element 1 and the other. On the other hand, if the charge trapping film 106 is thicker than 15 nm, the charge injected into the charge trapping film 106 in rewrite operation is not sufficiently localized, but is dispersed. Therefore, it is difficult to completely cancel the trapped charge by the write operation and erase operation. In contrast, if the thickness of the charge trapping film 106 is within the range above, it is possible to reduce the difference between one memory element and the other, and to increase the number of rewriting operation possible.

The silicon oxide film 105 is preferably between 1.5 nm and 15 nm in thickness. If the silicon oxide film 105 is thinner than 1.5 nm, the electrons (charge) stored in the memory storage sections scatter. As a result, the storing property of the memory element is deteriorated. On the other hand, if the silicon oxide film 105 is thicker than 15 nm, the short-channel effect of the memory element 1 will be accelerated.

It is preferable if the memory element 1 of the present invention further includes pocket injection sections 121. The pocket injection sections 121 have the same conduction type as that of the semiconductor substrate 101 (P-type in case of the N-channel type element). The pocket injection sections 121 have an effective concentration of impurity higher than that of the semiconductor substrate 101. The pocket injection sections 121 are respectively provided in the vicinity of PN junctions between (i) the channel region and (ii) the first diffusion layer region 102 and the second diffusion layer region 103.

After the gate electrode 109 is formed, the pocket injection sections 121 are formed by injecting, for example, $^{11}B^+$ ions at an angle of 15° to 45° with respect to a direction perpendicular to the substrate, with energy of 15 KeV to 100 KeV and in a dose amount of $1\times10^{13}/cm^3$ to $5\times10^{13}/cm^3$.

If the pocket injection sections 121 are provided, the potential shows a steep transition at the PN junctions. This accelerates generation of hot electrons and hot holes. As a result, the charge is injected more efficiently in the rewrite operation. Therefore, it is possible to rewrite information into the memory element 1 at a higher speed. Moreover, it is possible to suppress the short-channel effect of the memory element 1, and to attain miniaturization of the memory element 1.

Second Embodiment

Figure 5:
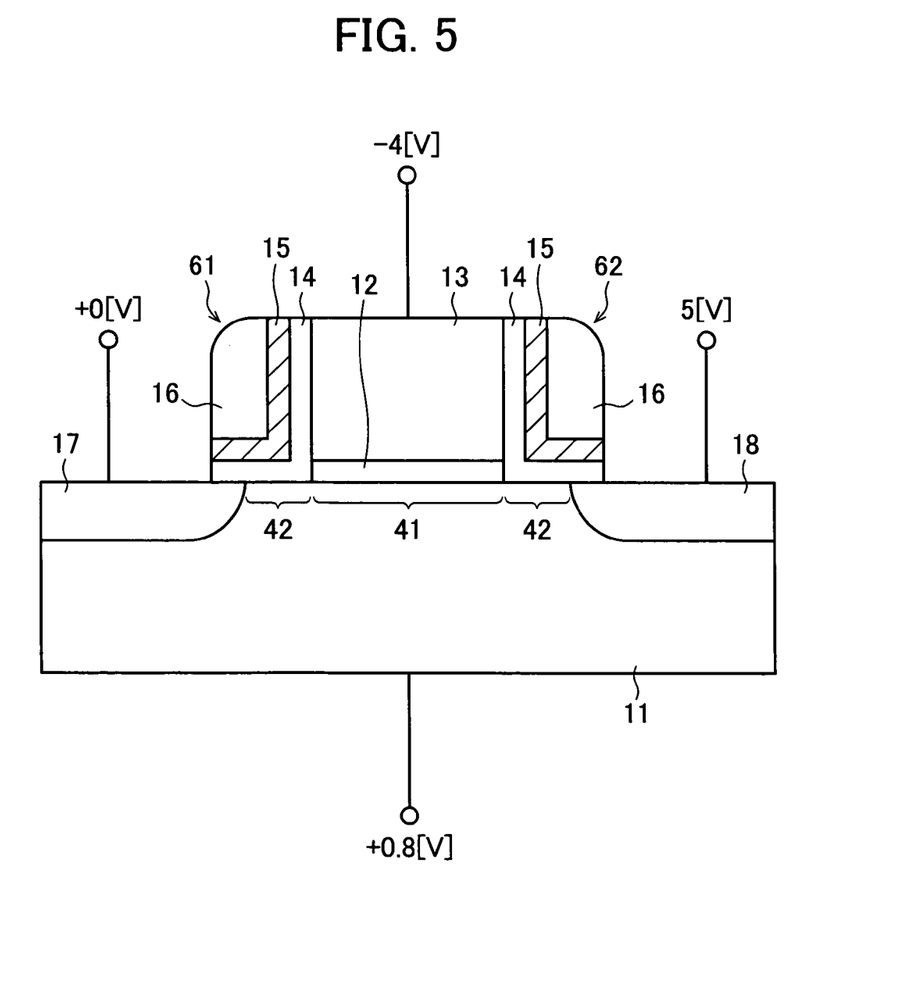
FIG. 5 is a schematic cross-sectional view illustrating a major part of a second example of the semiconductor memory device of the present invention.
Figure 6:
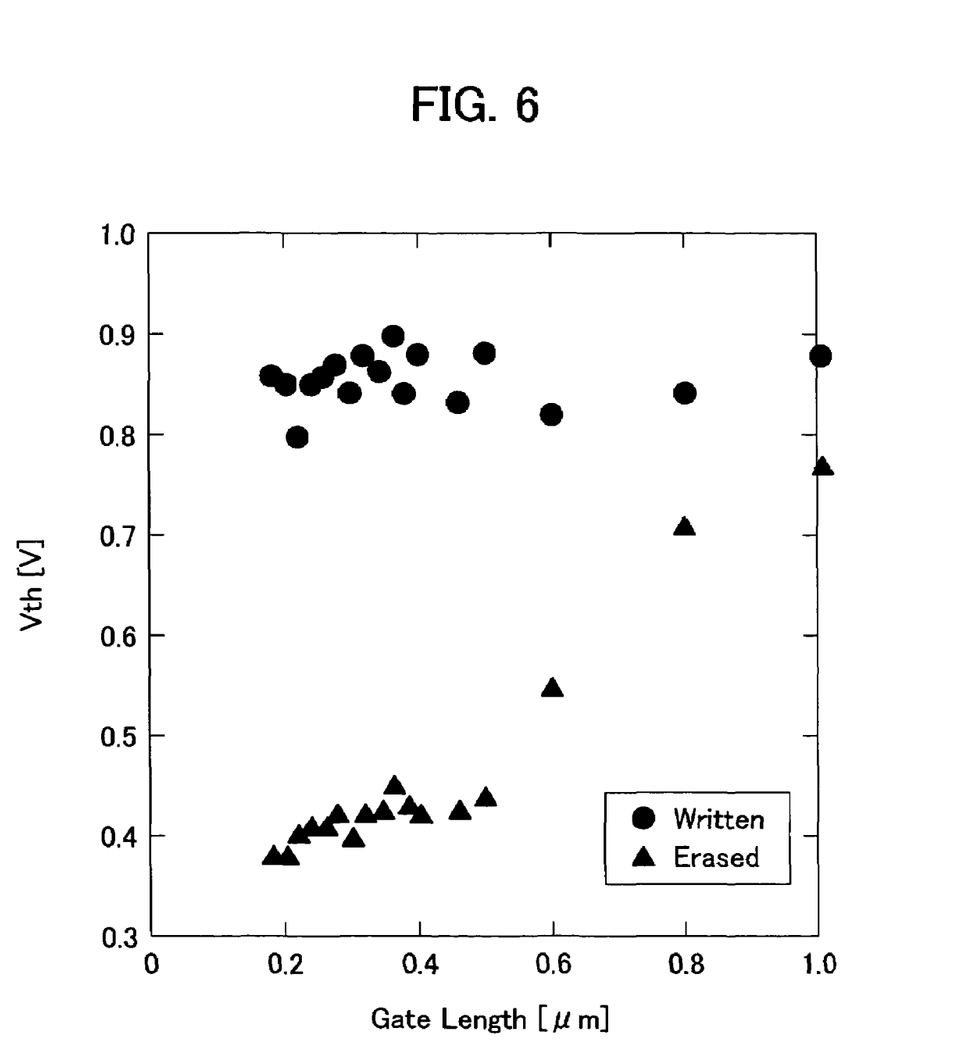
FIG. 6 is a graph illustrating the change of the erasability of the semiconductor memory dependent on the variety of a gate length.

With reference to FIGS. 5 and 6, the following describes a memory element that constitutes a semiconductor memory device of the present embodiment.

The memory element that constitutes the semiconductor memory device of the present embodiment is an non-volatile memory cell capable of storing two bits of information. As shown in FIG. 5, the semiconductor memory device includes a gate electrode 13 provided on a semiconductor substrate 11 with an intervening gate insulating film 12. The electrode 13 has substantially the same gate length as ordinary transistors. On sidewalls of the gate insulating film 12 and the gate electrode 13, there are provided charge storage sections 61 and 62 shaped like side wall spacers.

Opposite the gate electrode 13, each of the charge storage sections 61 and 62 has a first diffusion layer region 17 and a second diffusion layer region 18 (source/drain regions), respectively. The source/drain regions 17 and 18 are formed to offset with respect to an end of the gate electrode 13 (from the channel region 41 made up of the gate electrode 13). Therefore, the source/drain regions 17 and 18 are provided on the semiconductor substrate 11 in such a manner as to be isolated from one another and face-to-face with one another in a surface direction of the semiconductor substrate 11.

Preferably, each of the charge storage sections 61 and 62 is structured so that a silicon nitride film 15 is sandwiched between silicon oxide films 14 and 16. The silicon nitride film 15 has a function of trapping and storing charge (electrons or holes). The charge is stored mainly in those portions of the silicon nitride films 15 that are respectively on offset regions 42. Therefore, the offset regions 42 are respectively provided between the source/drain region 17 and the channel region 41, and between the source/drain region 18 and the channel region 41.

Each of the charge storage sections 61 and 62 is thus structured so that the silicon nitride film 15 is sandwiched between the silicon oxide films 14 and 16. Therefore, the charge is more efficiently injected into the charge storage sections 61 and 62. As a result, the rewrite operation (write operation and erase operation) is performed at a higher speed.

The charge storage sections 61 and 62 of the memory element that constitutes the semiconductor memory device of the present embodiment are formed independently from the gate insulating film 12. Therefore, the memory function performed by the charge storage sections 61 and 62 is separate from a transistor function performed by the gate insulating film 12. In addition, because the two charge storage sections 61 and 62 provided on the sides of the gate electrode 13 are isolated from one another by the gate electrode 13, interference between the sections 61 and 62 is effectively suppressed during the rewrite operation. Therefore, the memory transistor is capable of holding two bits of information and easy to miniaturize.

The source/drain regions 17 and 18 are formed to offset with respect to the gate electrode 13, so that when a voltage is applied to the gate electrode 13, the likelihood that the offset regions 42 invert changes with the charge stored in the charge storage sections 61 and 62. This improves the memory effect.

Further, when compared to ordinary logic transistors, the memory element of the present invention can more effectively prevent short the channel effect, and further reduce the gate length. In addition, the memory element is structurally suitable for suppressing the short channel effect. Therefore, a thicker gate insulating film can be used as compared with that of logic transistors. This improves reliability.

The structure of the charge storage sections 61 and 62 are not limited to the foregoing example. For example, the charge storage sections 61 and 62 may include quantum dots having a function of storing charge. In addition, it is not necessary that the charge storage sections 61 and 62 are shaped like sidewalls, as long as the charge storage sections 61 and 62 sandwich the gate electrode 13, and partially contact one of the semiconductor substrate 11 and the source/drain regions 17 and 18.

The memory element operates in the same manner as the memory element described in the first embodiment. The principles of operation are also the same as those in the first embodiment.

If the gate electrode 13 does not completely cover the channel region (offset regions 42), an inversion layer either disappears or forms in the channel region not covered by the gate electrode 13, depending on the presence/absence of excess electrons in the charge storage sections 61 and 62. A result is a large hysteresis (change of threshold value). If the offset regions 42 have too great a width, the drain current, hence the read rate, drops greatly. Therefore, it is preferred if the width of the offset regions 42 is determined in order to achieve sufficient hysteresis and read rate.

Even if the diffusion layer regions (source/drain regions) 17 and 18 extend to the ends of the gate electrode 13, that is, even if the diffusion layer regions 17 and 18 overlap with the gate electrode 13, the threshold value of the transistors hardly changed by the write operation. However, parasitic resistance at source/drain ends changed greatly, with the drain current showing a large drop (by more than one order of magnitude). Therefore, information can be read by detecting the drain current, achieving a function as a memory. To achieve a greater memory hysteresis effect, it is preferable if the gate electrode 13 does not overlap with the diffusion layer regions 17 and 18 (if the offset regions 42 are provided).

FIG. 6 illustrates how erasability of the memory element shown in FIG. 5 changes with respect to changes of the gate length. In an experiment to which FIG. 6 is based, the threshold value of the memory element was measured after information was written into the memory element. Then, the threshold value was measured again after the erase operation was performed according to the foregoing erase method. Before the write operation, the threshold value was initially about 0.4V.

After the write operation, the threshold value had been increased to substantially the same value (0.85V) irrespective of the gate length. On the other hand, after the erase operation, if the gate length was 0.6 μm or longer, the erasability showed a rapid drop as the gate length increased, whereas the threshold value had been decreased to substantially the same value (0.4V) if the gate length was 0.5 μm or shorter. This phenomenon can be explained as follows. In FIG. 4(b), if the gate length (channel length) is sufficiently short, the electrons 151 injected from the first diffusion layer region 102 into the P-type semiconductor substrate 101 reach the PN junction between the second diffusion layer region 103 and the P-type semiconductor substrate 101.

However, if the gate length (channel length) is long, the electrons are lost due to recombination and the like, or subjected to a repulsive force from the gate electrode having a negative potential. This drastically decreases the number of electrons that reach the PN junction. This explains the characteristic shown in FIG. 6. It is therefore preferable if the gate length of the memory element is shorter than 0.5 μm.

As described above, the memory element is particularly suitable for miniaturization. However, if the gate length is shorter than 0.015 μm, transistor operation per se is difficult, let alone miniaturization. All things considered, it is preferable if the gate length of the memory element is not shorter than 0.015 μm and not longer than 0.5 μm. Note that the phenomenon shown in FIG. 6 does not depend on the structure that is above the gate insulating film 12. Therefore, the requirements on the gate length of the memory element also apply to memory elements described in the other embodiments.

Third Embodiment

Figure 7:
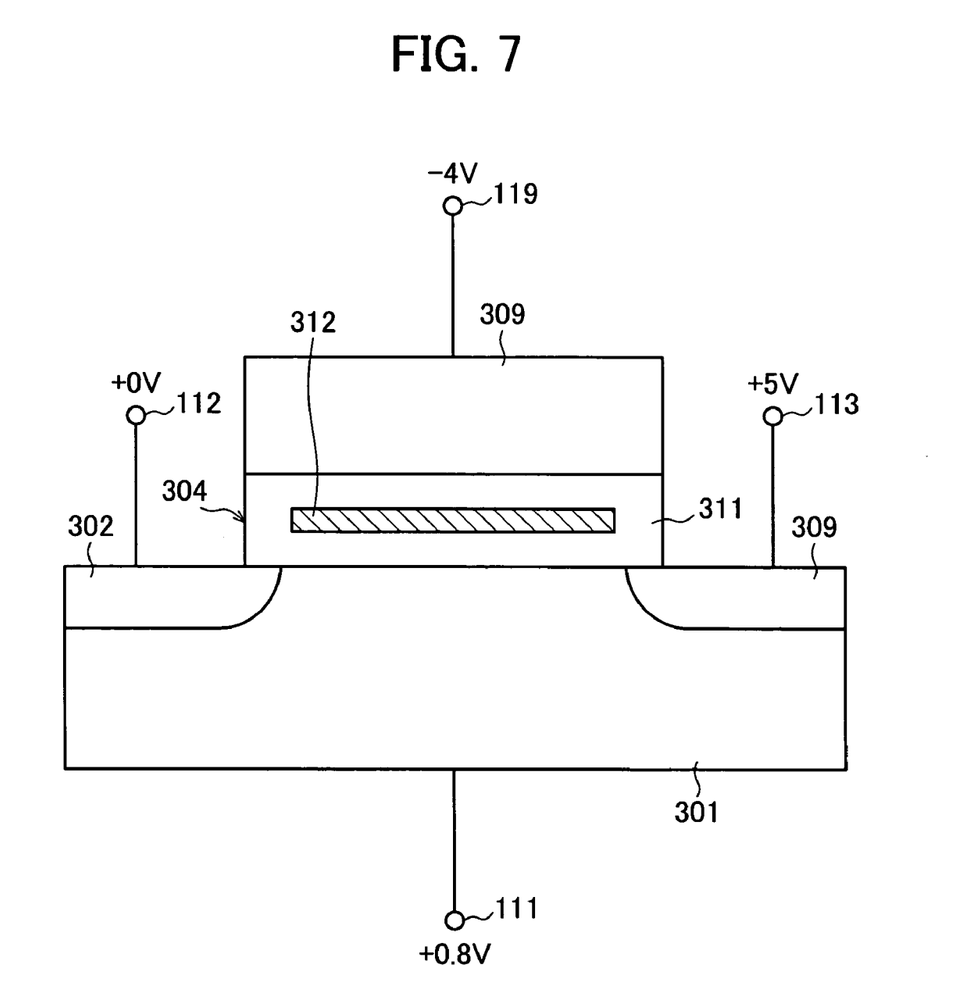
FIG. 7 is a schematic cross-sectional view illustrating a major part of a third example of the semiconductor memory device of the present invention.

With reference to FIG. 7, the following describes a memory element that constitutes a semiconductor memory device of the present embodiment.

In the memory element that constitutes the semiconductor memory device of the present embodiment, a memory storage section includes a floating gate. As shown in FIG. 7, a gate insulating film 304 is structured so that all circumferential surfaces of a floating gate 312, which is a polysilicon film, is covered with a silicon oxide film 311. Such a memory element performs one-bit operation, because the charge stored in the floating gate 312 can move freely within the floating gate 312.

However, because the erase operation can be performed in the same manner as described in the first embodiment, it is possible to decrease the operating voltages of the memory element. Therefore, it is possible to attain lower power consumption, and suppress deterioration of the memory element.

A first semiconductor memory device of the present invention includes a field-effect transistor provided on a surface of at least one of (i) a P-type semiconductor substrate, (ii) a P-well region provided in a semiconductor substrate, and (iii) a P-type semiconductor film provided on an insulator, the field-effect transistor including two N-type diffusion layer regions, a gate electrode, and a charge storage section, holes being injected into the charge storage section by applying a reference voltage to one of the N-type diffusion layer regions, a voltage higher than the reference voltage to the other of the N-type diffusion layer regions, a voltage lower than the reference voltage to the gate electrode, and a voltage higher than the reference voltage to the at least one of (i) the P-type semiconductor substrate, (ii) the P-well region, and (iii) the P-type semiconductor film.

In the first semiconductor memory device of the present invention, in injecting the holes into the charge storage section of the field-effect transistor, the forward voltage is applied to a PN junction between one of the N-type diffusion layer regions and the one of (i) the P-type semiconductor substrate, (ii) the P-well region, and (iii) the P-type semiconductor film. Therefore, it is possible to inject the holes into the charge storage section at the voltages lower than the voltages required if the forward voltage is not applied. This makes it possible to decrease the operating voltages of the semiconductor memory device. Thus, it is possible to suppress deterioration of the semiconductor memory device, and to attain lower power consumption.

The second semiconductor memory device of the present invention is identical to the first semiconductor memory device of the present invention except that the field-effect transistor is P-channel type in terms of polarity. Therefore, effects of the second semiconductor memory device of the present invention are identical to those of the first semiconductor memory device of the present invention.

In one aspect, an absolute value of a voltage difference between the at least one of the N-type diffusion layer regions and the one of (i) the P-type semiconductor substrate, (ii) the P-well region, and (iii) the P-type semiconductor film is not lower than 0.7V and not higher than 1V.

According to this aspect, it is possible to obtain a sufficient forward current at the PN junction between one of the N-type diffusion layer regions and the at least one of (i) the P-type semiconductor substrate, (ii) the P-well region, and (iii) the P-type semiconductor film, so that holes are generated in the PN junction between the other of the N-type diffusion layer regions and the at least one of (i) the P-type semiconductor substrate, (ii) the P-well region, and (iii) the P-type semiconductor film. At the same time, the forward current does not significantly increase the power consumption of the semiconductor memory device.

In one aspect, an absolute value of a voltage difference between the one of the P-type diffusion layer regions and the one of (i) the N-type semiconductor substrate, (ii) the N-well region, and (iii) the N-type semiconductor film is not lower than 0.7V and not higher than 1V.

According to this aspect, it is possible to obtain a sufficient forward current at the PN junction between one of the P-type diffusion layer regions and the one of (i) the N-type semiconductor substrate, (ii) the N-well region, and (iii) the N-type semiconductor film, so that electrodes are generated in the PN junction between the other of the P-type diffusion layer regions and the one of (i) the N-type semiconductor substrate, (ii) the N-well region, and (iii) the N-type semiconductor film. At the same time, the forward current does not significantly increase the power consumption of the semiconductor memory device.

In one aspect, the gate electrode has a gate length not shorter than 0.015 µm and not longer than 0.5 µm.

According to this aspect, it is possible to generate sufficient holes or electrons at the PN junction between the other of the N-type or P-type diffusion layer regions and the P-type or N-type semiconductor substrate (P-type or N-type semiconductor substrate or P-type or N-type semiconductor film), and to inject the holes or electrons into the charge storage section. In addition, the transistor operation, which is a basis of memory operation, is ensured.

In one aspect, the field-effect transistor includes two charge storage sections in a vicinity of respective ends of the N-type diffusion layer regions or the P-type diffusion layer regions.

According to this aspect, by respectively applying appropriate voltages to terminals so as to perform the rewrite operation and read operation, it is possible to change the amount of charge stored in a specified one of the charge storage sections, and to detect the amount of charge. That is, the single transistor can perform two-bit operation. Thus provided is a highly integrated semiconductor memory device that occupies smaller area per bit.

In one aspect, a gate insulating film of the field-effect transistor includes (a) a first insulating film that is in contact with one of the P-type semiconductor substrate, the P-well region, the P-type semiconductor film, the N-type semiconductor substrate, the N-well region, and the N-type semiconductor film, (b) a second insulating film that is in contact with the gate electrode, and (c) a charge trapping film sandwiched between the first insulating film and the second insulating film, the charge trapping film having a function of trapping charge; and the charge storage section being provided in the charge trapping film.

According to this aspect, the gate insulating film has a laminated structure in which the insulating films sandwich the charge trapping film having the function of trapping charge. Therefore, it is possible to prevent the charge stored in the charge trapping film from scattering and leaking out. Thus, a storage time of the semiconductor memory device is prolonged. In addition, because the charge storage section is provided in the charge trapping film, and the charge trapping film is sandwiched between the gate electrode and the semiconductor substrate, a sufficiently strong field is applied to the charge storage section, due to the voltage applied to the gate electrode. Thus, the holes or electrons are attracted by the field, and are efficiently injected into the charge storage section. Therefore, it is possible to increase the operational speed of the semiconductor memory device.

In one aspect, the first insulating film and the second insulating film are silicon oxide films.

According to this aspect, the first insulating film and the second insulating film sandwiching the charge trapping section are silicon oxide films, which have a high potential barrier with respect to charge and few defective levels.

Therefore, even if the first insulating film and the second insulating film are thin, it is possible to prevent the charge stored in the charge trapping film from scattering and leaking out. Thus, it is possible to make the gate insulating film of the semiconductor memory device thinner so as to suppress short-channel effects, thereby attaining further miniaturization.

In one aspect, the first insulating film and the second insulating film are between 1.5 nm and 15 nm in thickness.

According to this aspect, because the first insulating film and the second insulating film, which are silicon oxide films, are between 1.5 nm and 15 nm in thickness, it is possible to maintain a high operating speed while keeping an excellent storage property of the semiconductor memory device.

In one aspect, the charge trapping film is a silicon nitride film.

According to this aspect, the charge trapping film is a silicon nitride film, which has highly densified levels for trapping charge. Therefore, it is possible to increase the memory effect of the semiconductor memory device.

In one aspect, the charge trapping film is between 2 nm and 15 nm in thickness.

According to this aspect, because the charge trapping film is between 2 nm and 15 nm in thickness, it is possible to suppress differences among elements, thereby increasing the number of rewrite operation possible.

In one aspect, the charge trapping film is a silicon oxide film including silicon particles.

According to this aspect, because the charge trapping film is a silicon oxide film including silicon particles, it is possible to store charge in the silicon particles, thereby generating a memory effect.

In one aspect, the charge trapping film is a silicon oxide film doped with an impurity.

According to this aspect, because the charge trapping film is a silicon oxide film doped with an impurity, it is possible to store charge in the impurity part, thereby generating a memory effect.

In one aspect, the semiconductor memory device further includes a high-concentration impurity region provided at a position that is (a) inside one of the P-type semiconductor substrate, the P-well region, and the P-type semiconductor film, (b) in a vicinity of a junction between the N-type diffusion layer regions and the one of the P-type semiconductor substrate, the P-well region, and the P-type semiconductor film, and (c) under the gate electrode, a P-type impurity concentration in the high-concentration impurity region being higher than a P-type impurity concentration in a part of the one of the P-type semiconductor substrate, the P-well region, and the P-type semiconductor film, the part surrounding the high-concentration impurity region.

According to this aspect, the potential shows a steep transition at the junction between the N-type diffusion layer regions and the one of the P-type semiconductor substrate, the P-well region, and the P-type semiconductor film. Therefore, high-energy holes are generated, and charge is injected more efficiently in the write operation. Thus, it is possible to rewrite information into the semiconductor memory device at a higher speed. Moreover, it is possible to suppress the short-channel effects of the semiconductor memory device, thereby attaining further miniaturization.

In one aspect, the semiconductor memory device further includes a high-concentration impurity region provided at a position that is (a) inside one of the N-type semiconductor substrate, the N-well region, and the N-type semiconductor film, (b) in a vicinity of a junction between the P-type diffusion layer regions and the one of the N-type semiconductor substrate, the N-well region, and the N-type semiconductor film, and (c) under the gate electrode, an N-type impurity concentration in the high-concentration impurity region being higher than an N-type impurity concentration in a part of the one of the N-type semiconductor substrate, the N-well region, and the N-type semiconductor film, the part surrounding the high-concentration impurity region.

According to this aspect, the potential shows a steep transition at the junction between the P-type diffusion layer regions and the one of the N-type semiconductor substrate, the N-well region, and the N-type semiconductor film. Therefore, high-energy electrons are generated, and charge is injected more efficiently in the write operation. Thus, it is possible to rewrite information in the semiconductor memory device at a higher speed. Moreover, it is possible to suppress the short-channel effects of the semiconductor memory device, thereby attaining further miniaturization.

In one aspect, a third semiconductor memory device of the present invention includes a field-effect transistor provided on a surface of at least one of (i) a P-type semiconductor substrate, (ii) a P-well region provided in the P-type semiconductor substrate, and (iii) a P-type semiconductor film provided on an insulator, the field-effect transistor including two N-type diffusion layer regions, a gate electrode, and two charge storage sections, a gate insulating film of the field-effect transistor including (a) a first insulating film that is in contact with the at least one of (i) the P-type semiconductor substrate, (ii) the P-well region, and (iii) the P-type semiconductor film, (b) a second insulating film that is in contact with the gate electrode, and (c) a charge trapping film sandwiched between the first insulating film and the second insulating film, the charge trapping film having a function of trapping charge, the two charge storage sections being provided in such parts of the charge trapping film that are in a vicinity of respective ends of the N-type diffusion layer regions, holes being injected by applying a reference voltage to one of the N-type diffusion layer regions, a voltage higher than the reference voltage to the other of the N-type diffusion layer regions, a voltage lower than the reference voltage to the gate electrode, and a voltage higher than the reference voltage to the at least one of (i) the P-type semiconductor substrate, (ii) the P-well region, and (iii) the P-type semiconductor film, the holes being injected into the charge storage section provided in the vicinity of the end of the other of the N-type diffusion layer regions, electrons being injected by applying a reference voltage to one of the N-type diffusion layer regions, a voltage higher than the reference voltage to the other of the N-type diffusion layer regions, and a voltage higher than the reference voltage to the gate electrode, the electrons being injected into the charge storage section provided in the vicinity of the end of the other of the N-type diffusion layer regions.

According to this aspect, the two charge storage sections are provided in such parts of the charge trapping film that are in the vicinity of respective ends of the N-type diffusion layer regions, and the voltages are applied to nodes under the foregoing conditions in injecting the holes into the charge storage section of the field-effect transistor. Therefore, it is possible to rewrite, in one direction, information in a specified one of the two charge storage sections. Moreover, because the voltages are applied to the nodes under the foregoing conditions in injecting the electrons into the charge storage section of the field-effect transistor, it is possible to rewrite, in a direction opposite the one direction, information in the specified one of the two charge storage sections. Thus, it is possible to independently rewrite, in both directions, the information in the two charge storage sections. That is, the semiconductor memory device can perform two-bit rewrite operation.

Moreover, in rewriting information in the one direction, the forward voltage is applied to the one of the N-type diffusion layer regions and the at least one of (i) the P-type semiconductor substrate, (ii) the P-well region, and (iii) the P-type semiconductor film. Therefore, it is possible to inject the holes into the charge storage section at the voltages lower than the voltages required if the forward voltage is not applied. This makes it possible to decrease the operating voltages of the semiconductor memory device. Therefore, it is possible to suppress deterioration of the semiconductor memory device, and to attain lower power consumption.

In one aspect, an amount of charge in the charge storage section provided in the vicinity of the end of the other of the N-type diffusion layer regions is read out by applying a reference voltage to the other of the N-type diffusion layer regions, a voltage higher than the reference voltage to one of the N-type diffusion layer regions, and a voltage higher than the reference voltage to the gate electrode.

According to this aspect, in order to read information, electrons are moved from the other of the N-type diffusion layer regions into the one of the N-type diffusion layer regions. That is, the other of the N-type diffusion layer regions is used as a source region, and the one of the N-type diffusion layer regions is used as a drain region. Therefore, without being influenced by information stored in the charge storage section that is provided in the vicinity of the end of the one of the N-type diffusion layer regions, it is possible to detect information stored in the charge storage section that is provided in the vicinity of the end of the other of the N-type diffusion layer regions. That is, the semiconductor memory device can perform two-bit read operation.

A fourth semiconductor memory device of the present invention includes a field-effect transistor provided on a surface of at least one of (i) an N-type semiconductor substrate, (ii) an N-well region provided in the N-type semiconductor substrate, and (iii) a P-type semiconductor film provided on an insulator, the field-effect transistor including two P-type diffusion layer regions, a gate electrode, and two charge storage sections, a gate insulating film of the field-effect transistor including (a) a first insulating film that is in contact with the at least one of (i) the N-type semiconductor substrate, (ii) the N-well region, and (iii) the N-type semiconductor film, (b) a second insulating film that is in contact with the gate electrode, and a charge trapping film sandwiched between the first insulating film and the second insulating film, the charge trapping film having a function of trapping charge, the two charge storage sections being provided in such parts of the charge trapping film that are in a vicinity of respective ends of the P-type diffusion layer regions, electrons being injected by applying a reference voltage to one of the P-type diffusion layer regions, a voltage lower than the reference voltage to the other of the P-type diffusion layer regions, a voltage higher than the reference voltage to the gate electrode, and a voltage lower than the reference voltage to the at least one of (i) the N-type semiconductor substrate, (ii) the N-well region, and (iii) the N-type semiconductor film, the electrons being injected into the charge storage section provided in the vicinity of the end of the other of the P-type diffusion layer regions, holes being injected by applying a reference voltage to one of the P-type diffusion layer regions, a voltage lower than the reference voltage to the other of the P-type diffusion layer regions, and a voltage lower than the reference voltage to the gate electrode, the holes being injected into the charge storage section provided in the vicinity of the end of the other of the P-type diffusion layer regions.

The fourth semiconductor memory device of the present invention is identical to the third semiconductor memory device of the present invention except that the field-effect transistor is P-channel type in terms of polarity. Therefore, effects of the fourth semiconductor memory device of the present invention are identical to those of the third semiconductor memory device of the present invention.

In one aspect, an amount of charge in the charge storage section provided in the vicinity of the end of the other of the P-type diffusion layer regions is read out by applying a reference voltage to the other of the P-type diffusion layer regions, and a voltage lower than the reference voltage to the gate electrode.

According to this aspect, in order to read information, electrons are moved from the other of the P-type diffusion layer regions into the one of the P-type diffusion layer regions. That is, the other of the P-type diffusion layer regions is used as a source region, and the one of the P-type diffusion layer regions is used as a drain region. Therefore, without being influenced by information stored in the charge storage section that is provided in the vicinity of the end of the one of the P-type diffusion layer regions, it is possible to detect information stored in the charge storage section that is provided in the vicinity of the end of the other of the P-type diffusion layer regions. That is, the semiconductor memory device can perform two-bit read operation.

The invention being thus described, it will be obvious that the same way may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor memory device, comprising:
   a field-effect transistor provided on a surface of at least one of (i) a P-type semiconductor substrate, (ii) a P-well region provided in a semiconductor substrate, and (iii) a P-type semiconductor film provided on an insulator, the field-effect transistor including two N-type diffusion layer regions, a gate electrode, and a charge storage section,
   holes being injected into the charge storage section by applying a reference voltage to one of the N-type diffusion layer regions, a voltage higher than the reference voltage to the other of the N-type diffusion layer regions, a voltage lower than the reference voltage to the gate electrode, and a voltage higher than the reference voltage to the at least one of (i) the P-type semiconductor substrate, (ii) the P-well region, and (iii) the P-type semiconductor film.

2. A semiconductor memory device, comprising:
   a field-effect transistor provided on a surface of at least one of (i) an N-type semiconductor substrate, (ii) an N-well region provided in a semiconductor substrate, and (iii) a P-type semiconductor film provided on an insulator, the field-effect transistor including two P-type diffusion layer regions, a gate electrode, and a charge storage section,
   electrons being injected into the charge storage section by applying a reference voltage to one of the P-type diffusion layer regions, a voltage lower than the reference voltage to the other of the P-type diffusion layer regions, a voltage higher than the reference voltage to the gate electrode, and a voltage lower than the reference voltage to the at least one of (i) the N-type semiconductor substrate, (ii) the N-well region, and (iii) the N-type semiconductor film.

3. The semiconductor memory device as set forth in claim 1, wherein:
   an absolute value of a voltage difference between the one of the N-type diffusion layer regions and the at least one of (i) the P-type semiconductor substrate, (ii) the P-well region, and (iii) the P-type semiconductor film is not lower than 0.7V and not higher than 1V.

4. The semiconductor memory device as set forth in claim 2, wherein:
   an absolute value of a voltage difference between the one of the P-type diffusion layer regions and the at least one of (i) the N-type semiconductor substrate, (ii) the N-well region, and (iii) the N-type semiconductor film is not lower than 0.7V and not higher than 1V.

5. The semiconductor memory device as set forth in claim 1, wherein:
   the gate electrode has a gate length not shorter than 0.015 μm and not longer than 0.5 μm.

6. The semiconductor memory device as set forth in claim 2, wherein:
   the gate electrode has a gate length not shorter than 0.015 μm and not longer than 0.5 μm.

7. The semiconductor memory device as set forth in any one of claims 1 to 6, wherein:
   the field-effect transistor includes two charge storage sections in a vicinity of respective ends of the N-type diffusion layer regions or the P-type diffusion layer regions.

8. A semiconductor memory device as set forth in any one of claims 1 to 6, wherein:
   a gate insulating film of the field-effect transistor includes
      a first insulating film that is in contact with one of the P-type semiconductor substrate, the P-well region, the P-type semiconductor film, the N-type semiconductor substrate, the N-well region, and the N-type semiconductor film,
      a second insulating film that is in contact with the gate electrode, and
      a charge trapping film sandwiched between the first insulating film and the second insulating film, the charge trapping film having a function of trapping charge; and
   the charge storage section being provided in the charge trapping film.

9. The semiconductor memory device as set forth in claim 8, wherein:
   the first insulating film and the second insulating film are silicon oxide films.

10. The semiconductor memory device as set forth in claim 9, wherein:
    the first insulating film and the second insulating film are between 1.5 nm and 15 nm in thickness.

11. The semiconductor memory device as set forth in claim 8, wherein:
    the charge trapping film is a silicon nitride film.

12. The semiconductor memory device as set forth in claim 11, wherein:
    the charge trapping film is between 2 nm and 15 nm in thickness.

13. The semiconductor memory device as set forth in claim 8, wherein:
    the charge trapping film is a silicon oxide film including silicon particles.

14. The semiconductor memory device as set forth in claim 8, wherein:

the charge trapping film is a silicon oxide film doped with an impurity.

15. A semiconductor memory device as set forth in claim 8, further comprising:
a high-concentration impurity region provided at a position that is (a) inside one of the P-type semiconductor substrate, the P-well region, and the P-type semiconductor film, (b) in a vicinity of a junction between the N-type diffusion layer regions and the one of the P-type semiconductor substrate, the P-well region, and the P-type semiconductor film, and (c) under the gate electrode,
a P-type impurity concentration in the high-concentration impurity region being higher than a P-type impurity concentration in a part of the one of the P-type semiconductor substrate, the P-well region, and the P-type semiconductor film, the part surrounding the high-concentration impurity region.

16. A semiconductor memory device as set forth in claim 8, further comprising:
a high-concentration impurity region provided at a position that is (a) inside one of the N-type semiconductor substrate, the N-well region, and the N-type semiconductor film, (b) in a vicinity of a junction between the P-type diffusion layer regions and the one of the N-type semiconductor substrate, the N-well region, and the N-type semiconductor film, and (c) under the gate electrode,
an N-type impurity concentration in the high-concentration impurity region being higher than an N-type impurity concentration in a part of the one of the N-type semiconductor substrate, the N-well region, and the N-type semiconductor film, the part surrounding the high-concentration impurity region.

17. A semiconductor memory device, comprising:
a field-effect transistor provided on a surface of at least one of (i) a P-type semiconductor substrate, (ii) a P-well region provided in a semiconductor substrate, and (iii) a P-type semiconductor film provided on an insulator, the field-effect transistor including two N-type diffusion layer regions, a gate electrode, and two charge storage sections, a gate insulating film of the field-effect transistor including
a first insulating film that is in contact with the at least one of (i) the P-type semiconductor substrate, (ii) the P-well region, and (iii) the P-type semiconductor film,
a second insulating film that is in contact with the gate electrode, and
a charge trapping film sandwiched between the first insulating film and the second insulating film, the charge trapping film having a function of trapping charge,
the two charge storage sections being provided in such parts of the charge trapping film that are in a vicinity of respective ends of the N-type diffusion layer regions,
holes being injected by applying a reference voltage to one of the N-type diffusion layer regions, a voltage higher than the reference voltage to the other of the N-type diffusion layer regions, a voltage lower than the reference voltage to the gate electrode, and a voltage higher than the reference voltage to the at least one of (i) the P-type semiconductor substrate, (ii) the P-well region, and (iii) the P-type semiconductor film, the holes being injected into the charge storage section provided in the vicinity of the end of the other of the N-type diffusion layer regions,
electrons being injected by applying a reference voltage to one of the N-type diffusion layer regions, a voltage higher than the reference voltage to the other of the N-type diffusion layer regions, and a voltage higher than the reference voltage to the gate electrode, the electrons being injected into the charge storage section provided in the vicinity of the end of the other of the N-type diffusion layer regions.

18. The semiconductor memory device as set forth in claim 17, wherein:
an amount of charge in the charge storage section provided in the vicinity of the end of the other of the N-type diffusion layer regions is read out by applying a reference voltage to the other of the N-type diffusion layer regions, a voltage higher than the reference voltage to one of the N-type diffusion layer regions, and a voltage higher than the reference voltage to the gate electrode.

19. A semiconductor memory device, comprising:
a field-effect transistor provided on a surface of at least one of (i) an N-type semiconductor substrate, (ii) an N-well region provided in the N-type semiconductor substrate, and (iii) a P-type semiconductor film provided on an insulator, the field-effect transistor including two P-type diffusion layer regions, a gate electrode, and two charge storage sections, a gate insulating film of the field-effect transistor including
a first insulating film that is in contact with the at least one of (i) the N-type semiconductor substrate, (ii) the N-well region, and (iii) the N-type semiconductor film,
a second insulating film that is in contact with the gate electrode, and
a charge trapping film sandwiched between the first insulating film and the second insulating film, the charge trapping film having a function of trapping charge,
the two charge storage sections being provided in such parts of the charge trapping film that are in a vicinity of respective ends of the P-type diffusion layer regions,
electrons being injected by applying a reference voltage to one of the P-type diffusion layer regions, a voltage lower than the reference voltage to the other of the P-type diffusion layer regions, a voltage higher than the reference voltage to the gate electrode, and a voltage lower than the reference voltage to the at least one of (i) the N-type semiconductor substrate, (ii) the N-well region, and (iii) the N-type semiconductor film, the electrons being injected into the charge storage section provided in the vicinity of the end of the other of the P-type diffusion layer regions,
holes being injected by applying a reference voltage to one of the P-type diffusion layer regions, a voltage lower than the reference voltage to the other of the P-type diffusion layer regions, and a voltage lower than the reference voltage to the gate electrode, the holes being injected into the charge storage section provided in the vicinity of the end of the other of the P-type diffusion layer regions.

20. The semiconductor memory device as set forth in claim 19, wherein:
an amount of charge in the charge storage section provided in the vicinity of the end of the other of the P-type diffusion layer regions is read out by applying a reference voltage to the other of the P-type diffusion layer regions, and a voltage lower than the reference voltage to the gate electrode.

* * * * *